United States Patent
Bang

(10) Patent No.: US 10,214,834 B2
(45) Date of Patent: Feb. 26, 2019

(54) MONOCRYSTAL GROWTH SYSTEM AND METHOD CAPABLE OF CONTROLLING SHAPE OF INGOT INTERFACE

(71) Applicant: LG SILTRON INCORPORATED, Gumi-si, Gyeongsangbuk-do (KR)

(72) Inventor: In-Sik Bang, Gumi-si (KR)

(73) Assignee: SK SILTRON CO., LTD., Gumi-Si, Gyeongsangbuk-Do ( * ) Notice: Subject to any disclaimer, the term of this patent is extended or adjusted under 35 U.S.C. 154(b) by 0 days.

(21) Appl. No.: 15/540,219

(22) PCT Filed: Aug. 20, 2015

(86) PCT No.: PCT/KR2015/008692
§ 371 (c)(1),
(2) Date: Jun. 27, 2017

(87) PCT Pub. No.: WO2016/108381
PCT Pub. Date: Jul. 7, 2016

(65) Prior Publication Data
US 2017/0356100 A1    Dec. 14, 2017

(30) Foreign Application Priority Data
Dec. 30, 2014 (KR) ........................ 10-2014-0193373

(51) Int. Cl.
*C30B 15/20* (2006.01)
*C30B 15/26* (2006.01)
(Continued)

(52) U.S. Cl.
CPC .............. *C30B 15/26* (2013.01); *C30B 15/20* (2013.01); *C30B 15/28* (2013.01); *C30B 15/30* (2013.01); *C30B 29/06* (2013.01)

(58) Field of Classification Search
CPC ......... C30B 15/30; C30B 15/20; C30B 15/26; C30B 15/28
See application file for complete search history.

(56) References Cited

U.S. PATENT DOCUMENTS

| 6,869,477 B2 | 3/2005 | Haga et al. |
| 8,441,623 B2 | 5/2013 | Yanagimachi et al. |
(Continued)

FOREIGN PATENT DOCUMENTS

| JP | 63-195190 | 8/1988 |
| JP | 11-302099 | 11/1999 |
(Continued)

OTHER PUBLICATIONS

International Search Report (with English Translation) and Written Opinion dated Dec. 9, 2015 issued in Application No. PCT/KR2015/008692.

(Continued)

*Primary Examiner* — Matthew J Song
(74) *Attorney, Agent, or Firm* — Ked & Associates, LLP

(57) ABSTRACT

The present invention relates a method for controlling a growth interface shape while growing a monocrystal ingot by a Czochralski method, the method including a step of starting a growth of the monocrystal ingot after setting a control condition of a monocrystal growing process so that an interface of the ingot becomes a target shape; a step of deriving a measurement value by measuring a weight of the ingot grown for a predetermined time by means of a load cell disposed on an upper portion the monocrystal ingot; a step of deriving a theoretical value of the weight of the monocrystal ingot through a diameter of the monocrystal ingot measured by a diameter measuring camera disposed outside of a process chamber for a predetermined time and a height of the monocrystal ingot grown for the predetermined time; a step of predicting a growth interface shape of a growing (Continued)

monocrystal ingot by deriving a difference between the measurement value and the theoretical value; and changing process conditions during growth of the monocrystal ingot by comparing the predicted interface shape of the monocrystal ingot with the targeted interface shape of the monocrystal ingot. Therefore, the interface shape of the growing ingot may be predicted during the growing process of the monocrystal ingot, and the process conditions may be controlled to grow the silicon ingot in the targeted interface shape.

17 Claims, 7 Drawing Sheets

(51) Int. Cl.
    *C30B 15/28*     (2006.01)
    *C30B 15/30*     (2006.01)
    *C30B 29/06*     (2006.01)

(56) References Cited

U.S. PATENT DOCUMENTS

| | | |
|---|---|---|
| 2003/0209186 A1 | 11/2003 | Haga et al. |
| 2006/0005761 A1 | 1/2006 | Kulkarni et al. |
| 2006/0130740 A1 | 6/2006 | Sakurada |
| 2010/0031869 A1 | 2/2010 | Iida et al. |
| 2010/0100217 A1* | 4/2010 | Bandoh et al. ........ G05B 13/04 700/104 |
| 2010/0128253 A1 | 5/2010 | Yanagimachi et al. |
| 2010/0242836 A1* | 9/2010 | Korb et al. ............. C30B 15/24 117/201 |
| 2015/0197874 A1 | 7/2015 | Kang et al. |

FOREIGN PATENT DOCUMENTS

| | | |
|---|---|---|
| JP | 2002-137988 | 5/2002 |
| JP | 2004-345907 | 12/2004 |
| JP | 2005-015313 | 1/2005 |
| JP | 2007-223830 | 9/2007 |
| JP | 2008-001583 | 10/2008 |
| JP | 2011-157221 | 8/2011 |
| KR | 10-2002-0081343 | 10/2002 |
| KR | 10-2006-0048231 | 5/2006 |
| KR | 10-2010-0049062 | 5/2010 |
| KR | 10-2014-0011625 | 1/2014 |

OTHER PUBLICATIONS

Korean Notice of Allowance dated Sep. 29, 2016 issued in Application No. 10-2014-0193373.
Japanese Office Action dated Jul. 17, 2018 issued in Application No. 2017-534949.

* cited by examiner

ORIGINAL WEIGHT W1
ORIGINAL HEIGHT h1

WEIGHT AFTER UNIT TIME W2
HEIGHT AFTER UNIT TIME h2

(a)

(b)

(c)

(a)        (b)        (c)

MONOCRYSTAL GROWTH SYSTEM AND METHOD CAPABLE OF CONTROLLING SHAPE OF INGOT INTERFACE

CROSS-REFERENCE TO RELATED PATENT APPLICATIONS

This application is a U.S. National Stage Application under 35 U.S.C. § 371 of PCT Application No. PCT/KR2015/008692, filed Aug. 20, 2015, which claims priority to Korean Patent Application No. 10-2014-0193373, filed Dec. 30, 2014, whose entire disclosures are hereby incorporated by reference.

TECHNICAL FIELD

The present invention relates to a system and a method for growing a monocrystal capable of controlling a shape of an ingot interface, and more particularly, relates to a system and a method for growing a monocrystal capable of controlling a targeted interface shape by determining an interface shape of a growing ingot in a monocrystal growing apparatus.

BACKGROUND ART

A silicon wafer manufacturing process is generally performed by growing a silicon monocrystal by a Czochralski (CZ) method. The Czochralski method is a method of growing the silicon monocrystal by charging a polysilicon into a quartz crucible and subjecting to a high temperature to form a silicon melt solution, and then contacting a silicon seed to the silicon melt solution and slowly rotating.

A silicon ingot is formed by pulling the silicon seed up, and a silicon wafer is manufactured by processes such as a slicing for cutting such a ingot perpendicular to a crystal growing direction, a lapping for mitigating applied damage during the slicing, a polishing to make a rough wafer surface to have a high level of flatness, and the like.

Since a silicon wafer is manufactured by slicing a silicon ingot, the quality of the silicon ingot may directly indicate the quality of the silicon wafer. Accordingly, there has been proposed various methods for improving the quality of a silicon ingot such as a method of controlling the diameter of the ingot to be constant during growth of the ingot.

As one example, a monocrystal growing apparatus for controlling the diameter of a silicon ingot to be constant includes a sensor part sensing characteristics of a meniscus which is a contact surface between the silicon melt solution of the quartz crucible and the growing ingot, and a diameter deriving part for deriving the diameter of the ingot through the characteristics of the meniscus detected by the sensor part. And a driver connected to the sensor part to change a sensing area of the sensor part, and a control part controlling the diameter of the ingot to increase or decrease based on the diameter of the ingot derived through the diameter deriving part. Accordingly, it is possible to accurately control the diameter of the ingot by calculating the diameter of the actual ingot by changing the sensing area of the sensor or correcting the derived diameter.

As described above, a method for improving the quality of the ingot has been proposed, but there is no method for confirming a growth interface shape of the ingot during growth of the ingot.

FIG. 1 is a view illustrating various interface shapes of a growing ingot.

Referring to FIG. 1, an interface of the ingot may be grown in a concave shape like (a) and (b) on the basis of a growth direction, flat shape like (c), or convex shape like (d). Conventionally, such an interface of the ingot may not be confirmed during a growing process of the ingot, but after growth of the ingot is completed, the quality of the ingot is checked and it may be confirmed whether the interface of the ingot is convex or concave.

In fact, the shape of the ingot interface during growth of the monocrystal has a great influence on the final quality of the ingot, and if the change in the growing interface may be determined in real time, the quality of RRG or ORG may be improved and the growth rate of the monocrystal may also be increased by controlling a balance of heat that escapes to the ingot. Therefore, in growing of the monocrystal, a method of determining the change of the interface during growth of the ingot is required.

DISCLOSURE

Technical Problem

The present invention is directed to solve the above problems and provide a system and a method for growing a monocrystal which may manufacture a monocrystal ingot in a targeted interface shape of the ingot by predicting an interface shape of the ingot during the growing process of the ingot.

The present invention is directed to provide a system and a method for growing a monocrystal which may control RRG (Radial Resistivity Gradient) or ORG (Oxygen Radial Gradient) of a manufactured silicon ingot by predicting and controlling a current interface shape of the ingot by providing a system for comparing the actual weight of a growing ingot with a theoretical value through diameter measurement.

Technical Solution

The embodiment of the present invention provides a method for controlling a growth interface shape while growing a monocrystal ingot by the Czochralski method that may include: starting a growth of the monocrystal ingot after setting a control condition of a monocrystal growing process so that an interface of the ingot becomes a target shape; deriving a measurement value by measuring the weight of the ingot grown for a predetermined time by means of a load cell disposed on an upper portion the monocrystal ingot; deriving a theoretical value of the weight of the monocrystal ingot through a diameter of the monocrystal ingot measured by a diameter measuring camera disposed outside of a process chamber for a predetermined time and a height of the monocrystal ingot grown for the predetermined time; predicting a growth interface shape of a growing monocrystal ingot by deriving a difference between the measurement value and the theoretical value; and changing process conditions during the growth of the monocrystal ingot by comparing the predicted interface shape of the monocrystal ingot with the targeted interface shape of the monocrystal ingot.

Advantageous Effects

According to the present invention, the interface shape of the growing ingot may be predicted in real time during the growing process of the monocrystal ingot, and process conditions may be controlled to grow the silicon ingot in the targeted interface shape. Therefore, the monocrystal growing method of the embodiment may improve the RRG or ORG quality of the grown ingot, thereby providing a silicon wafer that meets the needs of customers.

BEST MODES FOR CARRYING OUT THE INVENTION

Hereinafter, embodiments will be described in detail with reference to the accompanying drawings. However, the present disclosure is not limited to embodiment.

In describing embodiments of the present disclosure, detailed description of a known function or configuration may be omitted to clear the gist of the present disclosure.

The present invention provides a monocrystal growing method capable of predicting an interface shape of an ingot during a growing process of the ingot to manufacture a monocrystal ingot in a targeted interface shape of the ingot, and an embodiment of a monocrystal growing apparatus for this purpose is disclosed.

Figure 2:
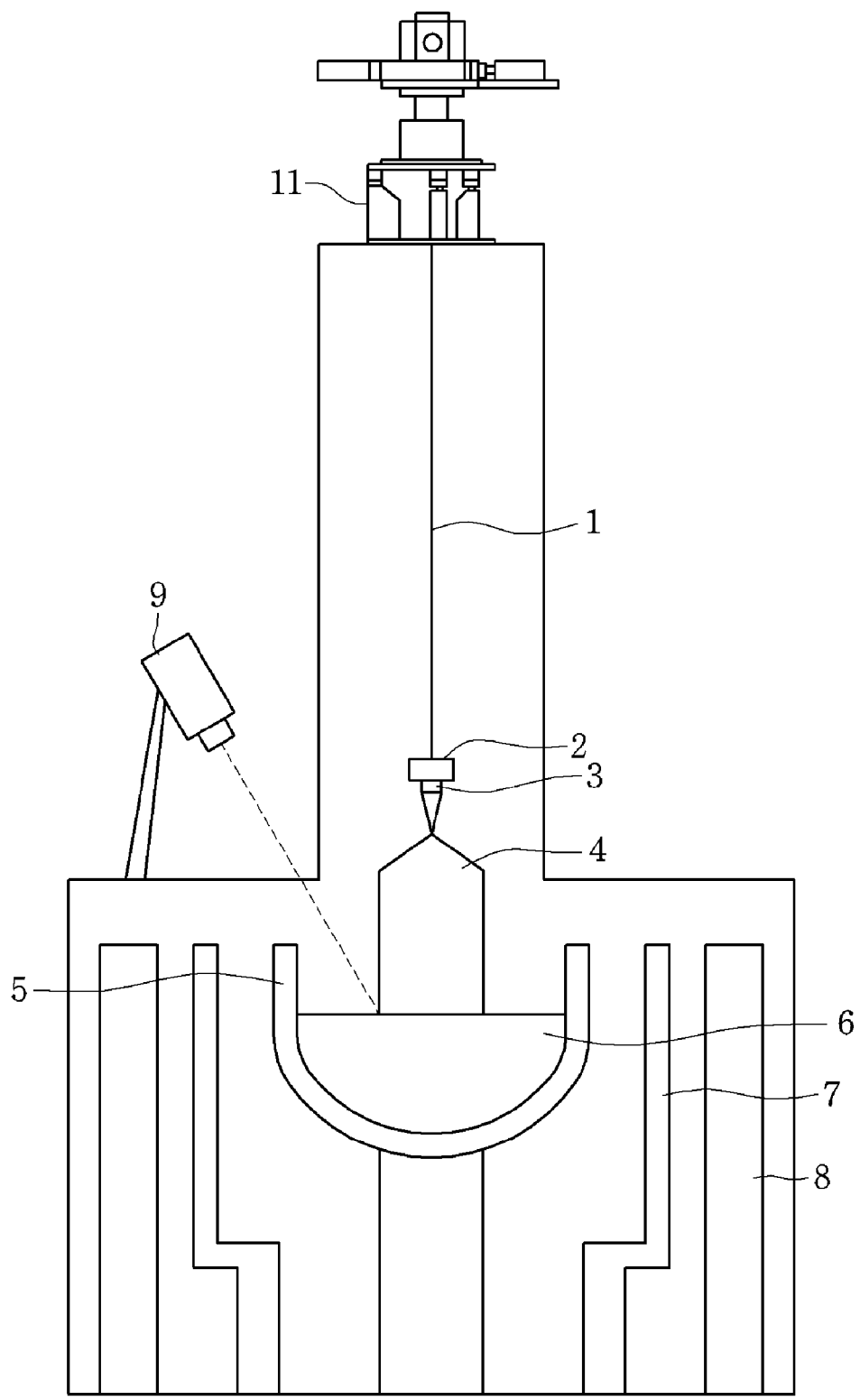
FIG. 2 is a cross-sectional view illustrating a monocrystal growing apparatus according to an embodiment.

FIG. 2 is a cross-sectional view illustrating a monocrystal growing apparatus according to an embodiment.

Referring to FIG. 2, in a monocrystal growing apparatus of the embodiment, a seed chuck 2 is provided at a lower end of a wire 1, and a seed crystal 3 is coupled to the seed chuck 2 and the seed crystal 3 is dipped into a silicon melt solution 6. A silicon ingot 4 is formed by pulling up the dipped seed crystal 3, and a load cell 11 capable of measuring a weight of the silicon ingot 4 is provided on an upper end of the wire 1. And a camera 9 photographing an interface of the silicon melt solution 6 and the silicon ingot 4 through quartz glass to detect a diameter of the silicon ingot is provided on the outside of a process chamber. And a heater 7 for applying heat to the silicon melt solution 6 is disposed and a heat insulating member 8 is provided outside the heater 7 to protect the process chamber and to apply certain amounts of heat to the silicon melt solution.

In the present invention, the load cell 11 is a member for measuring the weight of a growing ingot in real time, and it may be provided to derive an actual value of the ingot weight.

Also, the camera 9 is a member for measuring the diameter of the growing ingot in real dime and it may derive a weight increase amount of the ingot per unit time through the diameter of the ingot measured by the camera 9 and an amount of change in height of the ingot per unit time. The weight increment per unit time corresponds to a mathematically calculated theoretical value.

In the embodiment of the present invention, a current interface shape of the ingot may be predicted by comparing the measurement value of the ingot weight with the theoretical value. In the case in which the interface shape of the ingot is different from a target shape, a parameter affecting the crystal growth rate of the monocrystal may be adjusted so that the growth interface may be adjusted to the target shape. The present invention is a monocrystal growing method capable of predicting the interface shape of the ingot in real time, and the interface is controlled at the time when ingot growth is not completed, so that the grown ingot may have a desired quality.

Figure 3:
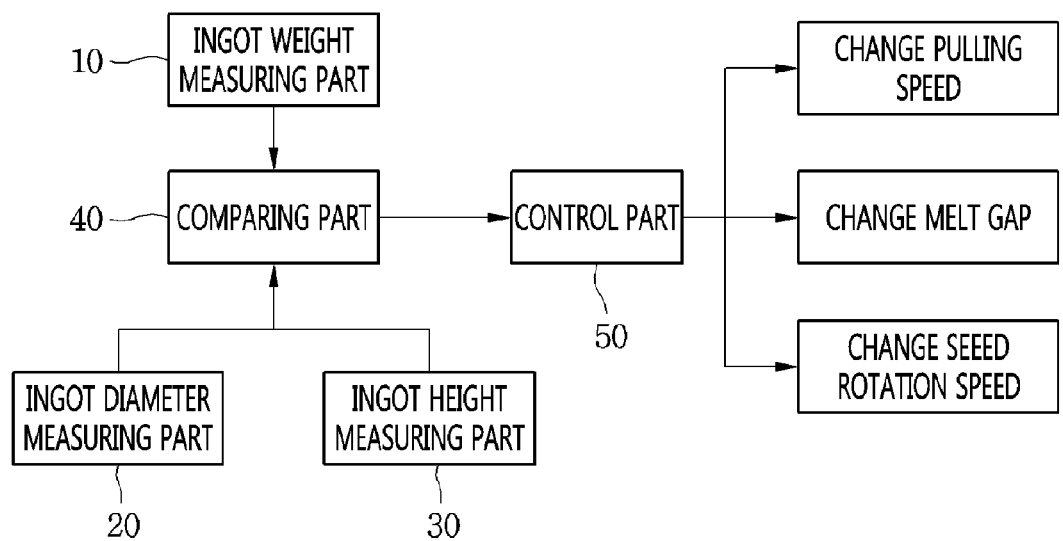
FIG. 3 is a view illustrating a monocrystal growing system according to the embodiment.

FIG. 3 is a view illustrating a monocrystal growing system according to the embodiment.

Referring to FIG. 3, the monocrystal growing system of the embodiment may include an ingot weight measuring part 10, an ingot diameter measuring part 20, an ingot height measuring part 30, a comparing part 40, and a control part 50.

The ingot weight measuring part 10 may be performed by a load cell provided on an upper portion of a monocrystal growing apparatus, and measures a weight increase amount of the ingot for a predetermined time (t1 to t2). That is, by subtracting the weight of the ingot at the time t1 from the weight of the ingot at the time t2, a measurement value which is the weight increase amount of the ingot for the time from t1 to t2 is calculated.

The ingot diameter measuring part 20 is provided on the upper portion of the monocrystal growing apparatus and it may be performed by a camera that illuminates the interface of the ingot and calculates the diameter of the ingot to be grown for the time from t1 to t2.

The ingot height measuring part 30 measures a length of the ingot grown for the time from t1 to t2, and the length of the grown ingot may be calculated by multiplying a current ingot pulling speed by the taken time t2−t1. In addition, in the case in which the pulling speed of the ingot is changed, the length of the grown ingot may be calculated by checking the position of the seed chuck at t1 and t2.

The ingot diameter measuring part 20 and the ingot height measuring part 30 are provided to derive a theoretical value when the ingot is grown for a time from t1 to t2 (hereinafter, referred to as a unit time). The theoretical value is the weight of the ingot obtained when the grown ingot is assumed to be a cylindrical shape having the same diameter and constant height. That is, the theoretical value may be calculated through an equation related to the length of the ingot, the diameter of the ingot, and the density of the ingot measured for a unit time.

The comparing part 40 compares the measurement value obtained by measuring the weight increase amount of the ingot for the unit time with the theoretical value calculated by the height and diameter of the ingot.

The control part 50 controls the interface shape of the ingot to be grown by changing process conditions of the monocrystal growing apparatus according to the comparison result between the measurement value and the theoretical value. In the case in which the measurement value and the theoretical value appear to be the same, it may be assumed that the shape of the currently growing ingot is an ideal cylindrical shape, and accordingly, it may be assumed that the interface shape of the ingot is also flat. That is, in the case in which a targeted interface shape of the ingot is a flat shape, the control part 50 changes the pulling speed of the ingot according to the result shown in the comparing part 40, so that the ingot may be grown to the targeted interface of the ingot. In addition, changed process conditions may be implemented by changing a seed rotation speed or changing a melt gap.

Figure 4:
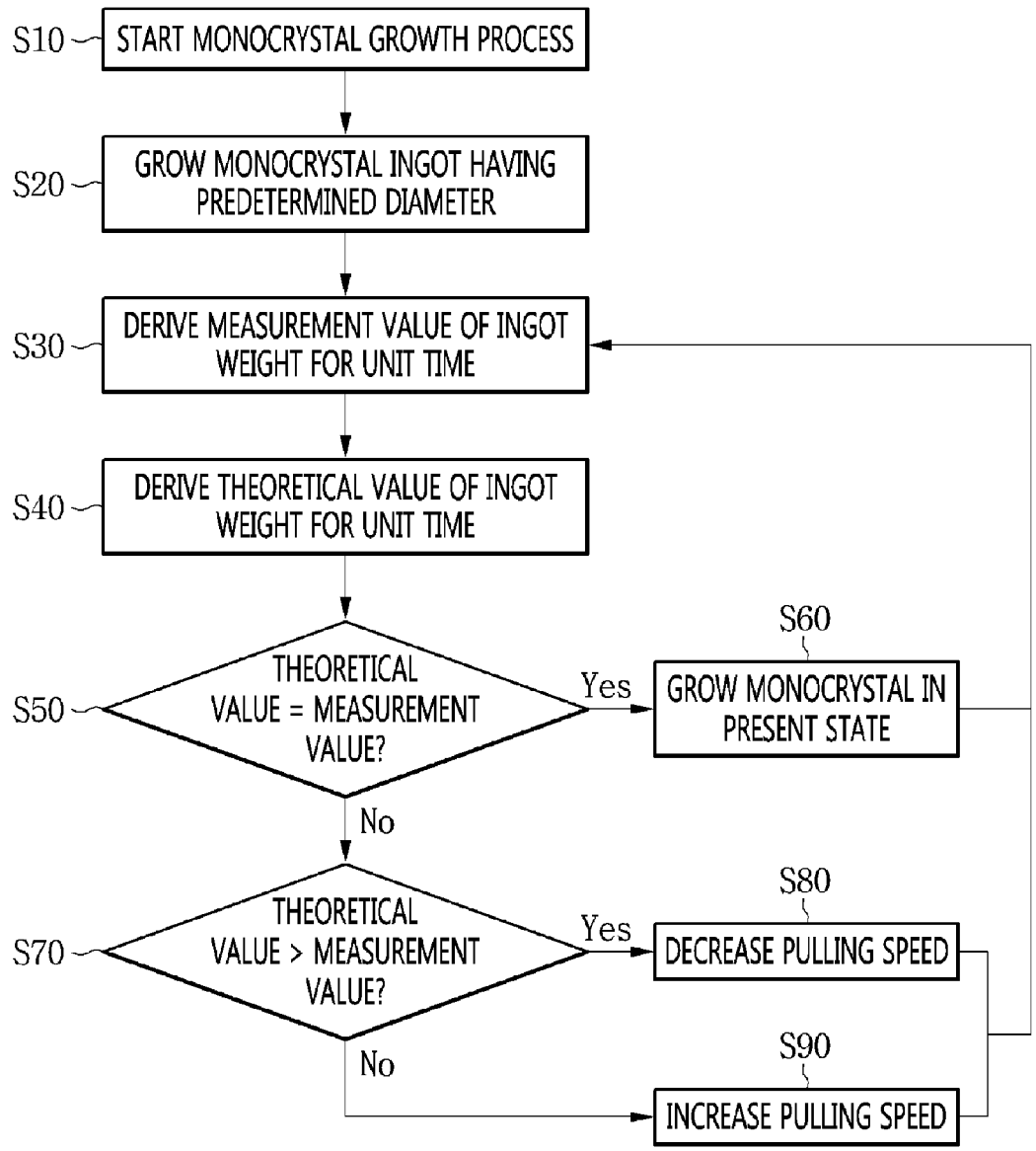
FIG. 4 is a flowchart illustrating a method of growing a monocrystal according to the embodiment.

FIG. 4 is a flowchart illustrating a method of growing a monocrystal according to the embodiment. A monocrystal growing method capable of controlling the ingot interface shape of the present invention/ill be described in detail with reference to FIG. 4.

First, the process conditions inside the monocrystal growing apparatus shown in FIG. 2 are set and a monocrystal growing process is started (S10). A monocrystal ingot having a predetermined diameter is grown by pulling a seed dipped in a quartz crucible through a wire (S20).

Then, while the monocrystal ingot is being grown, the weight of the monocrystal ingot for a unit time is measured through the load cell and set as the measurement value (S30).

And then, the theoretical value of the ingot weight changed for a unit time is derived from the diameter value of the ingot for the unit time measured from the diameter measuring camera disposed outside a chamber and the change value of the height of the ingot for the unit time (S40).

A method for obtaining the measurement value and the theoretical value will be described with reference to FIG. 5.

Figure 5:
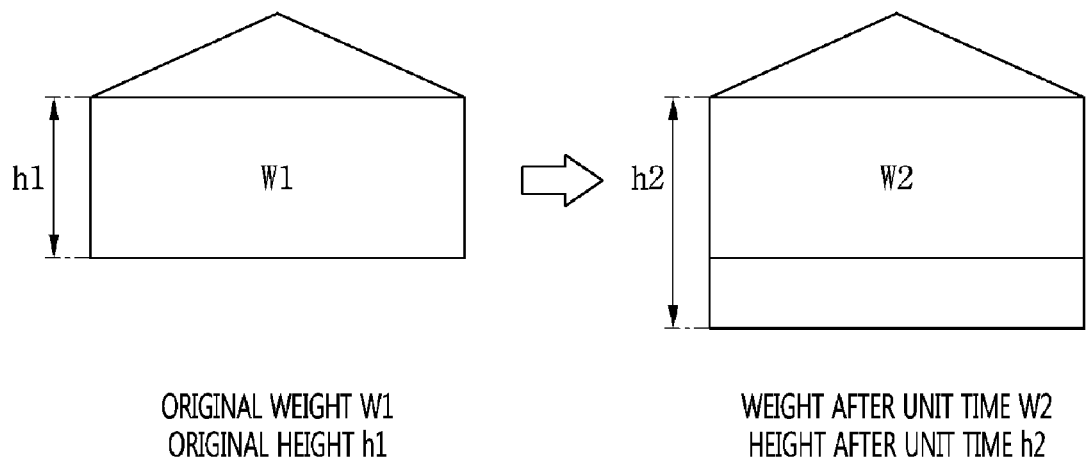
FIG. 5 is a view illustrating a method of deriving a measurement value and a theoretical value of a weight of an ingot being grown according to the embodiment.

FIG. 5 is a view illustrating a method of deriving a measurement value and a theoretical value of a weight of an ingot being grown according to the embodiment.

The method of obtaining the measurement value is as follows. As shown in the figure, a height of a body part of the ingot at the time t1 at which the weight of the ingot is to be measured is h1, and at this time, the weight of the ingot is measured by the load cell and represents w1. Then, a height of the body part of the ingot measured at the time t2 after a predetermined time is h2, and the weight of the ingot is measured again with the load cell to obtain a value w2 representing the weight of the ingot. That is, it may be seen that the measurement value of the weight of the ingot grown for the time from t1 to t2 (hereinafter, referred to as the unit time) is w2−w1.

The method of obtaining the theoretical value of the ingot weight is as follows.

Since the height of the ingot grows from h1 to h2 after the unit time, the height of the ingot grown for the unit time is obtained by subtracting h1 from h2. The theoretical value of the ingot weight grown for the unit time may be calculated by an equation relating to the height h2−h1 of the ingot changed for the unit time and a diameter r of the ingot for the unit time measured by the diameter measuring camera. Here, the diameter r of the ingot measured for the unit time is controlled so that the diameter is constant in the monocrystal manufacturing process, thereby having a constant value, but in the case in which the diameter changes for the unit time due to other process factor, an average value of the diameter may be used for the unit time.

The theoretical value of the ingot weight changed for the unit time may be calculated by a following equation.

$$\Delta W = \pi (r/2)^2 \times (h2-h1) \times (K)$$  Equation 1

Here, $\Delta W$ is the theoretical value of the ingot weight changed for the unit time, r is the diameter of the ingot measured from the diameter measuring camera, h2−h1 is the height of the ingot changed for the unit time, and K represents the density of the ingot.

Next, the theoretical value $\Delta W$ of the ingot derived from Equation 1 is compared with the measurement value w2−w1 which is the change amount of the actual ingot weight measured by the load cell (S50).

Figure 1:
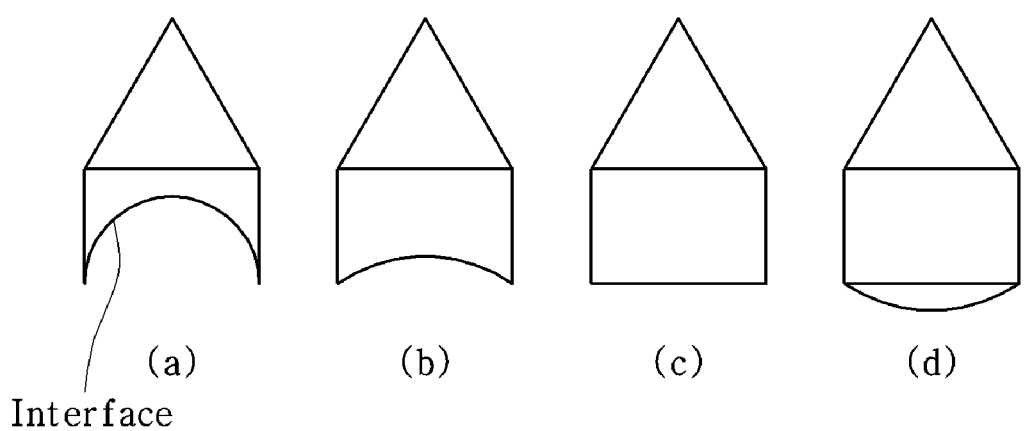
FIG. 1 is a cross-sectional view illustrating various examples of an interface shape of a conventional grown ingot.

In the case in which the measurement value of the ingot weight and the theoretical value thereof appear to be the same, the growth interface of the currently growing ingot may be determined as flat as shown in (c) of FIG. 1. In the case of manufacturing a wafer having a flat growth interface, if the theoretical value and the measurement value appear to be the same, the growing process of the monocrystal ingot is continuously performed under the current process conditions (S60).

If, the theoretical value is not equal to the measurement value, it is determined whether the theoretical value is larger than the measurement value (S70), and the control value of the monocrystal ingot growing process is changed. In the embodiment, as a factor influencing the growth speed of the monocrystal, the pulling speed of the monocrystal ingot is used as a control factor, and in the case in which the theoretical value is larger than the measurement value, the pulling speed is set to be decreased by a predetermined value (S80), and the growth speed of the monocrystal ingot may be reduced. However, the present invention is not limited thereto, and in addition to the control of the pulling speed of the monocrystal ingot proposed in the present invention, the interface shape of the silicon ingot may be controlled through a melt gap control, a seed rotation control, a rotation control of crucible, and argon gas flow rate control.

Meanwhile, in the case in which the theoretical value is smaller than the measurement value, the pulling speed is set to be increased by a predetermined value (S90), and the growth speed of the monocrystal ingot may be increased.

Figure 6:
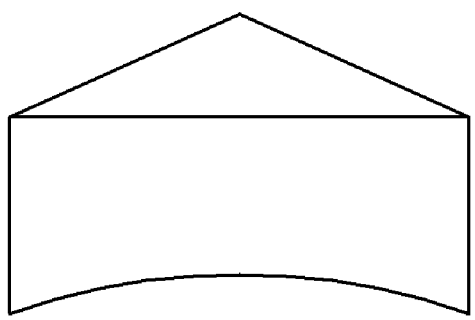
FIG. 6 is a view illustrating a method of predicting an interface shape of an growing ingot according to the embodiment.
Figure 6:
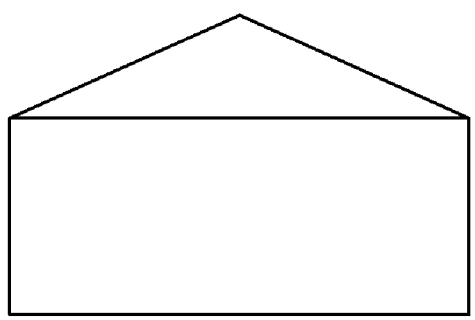
Figure 6:
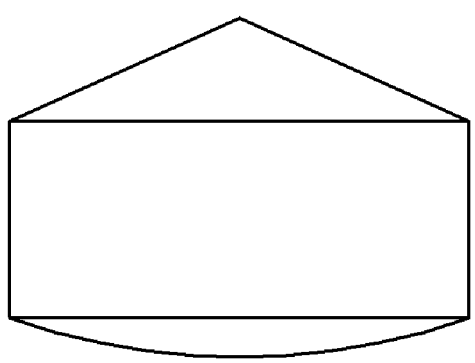

FIG. 6 is a view illustrating a method of predicting an interface shape of a growing ingot according to the embodiment. Referring to FIG. 6, in step S50 and step S70, it is possible to determine the interface shape of the ingot by comparing the theoretical value with the measurement value of the ingot.

FIG. 6 discloses a shape in which the shape of the ingot interface is concavely recessed upward, is flat, or convexly protrudes downward. When a wafer is manufactured with such a grown ingot, the RRG quality corresponding to the resistivity difference between a center portion and an edge portion of the wafer is different depending on the interface shape.

The ingot disclosed in (a) is in a state in which the interface shape is concavely recessed upward, and in the ingot having the interface as shown in (a), the concavely recessed portion is reflected in theactual measurement value, so that the actual measurement value of the ingot weight may be smaller than the theoretical value. The ingot disclosed in (b) has a flat interface shape and the ingot having the interface as shown in (b) may have the actual measurement value of the ingot weight equal to the theoretical value. And, the ingot disclosed in (c) has a shape in which the interface shape convexly protrudes downward, and in the ingot having the interface as shown in (c), the convexly protruding portion is reflected in the actual measurement value, so that the actual measurement value of the ingot weight may be larger than the theoretical value.

Figure 7:
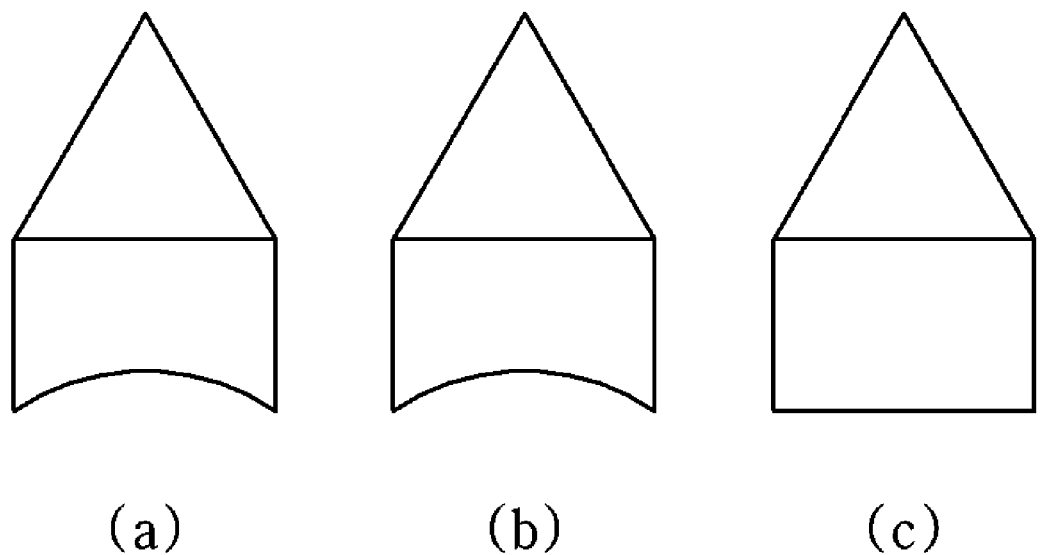
FIG. 7 is a view illustrating a control method of growing a monocrystal according to the interface shape of the growing ingot according to the embodiment.

FIG. 7 is a view illustrating a control method of growing a monocrystal according to an interface shape of a growing ingot according to the embodiment.

Referring to FIG. 7, (a) is assumed to be a target growth interface shape of an ingot. At this time, examples of the predicted growth interface of the monocrystal ingot are disclosed in (b) and (c) by comparing the difference between the measurement value and the theoretical value of the weight of the monocrystal ingot according to the embodiment.

In the case of (b), since it matches the targeted interface shape of (a), the monocrystal ingot is grown while maintaining the current process conditions. Meanwhile, in the case of (c), since the predicted interface shows a flat shape, it may be judged that the growth speed of the monocrystal is slower than the growth speed for forming the targeted interface. Therefore, a user can increase the pulling speed of the monocrystal ingot by a predetermined value based on the difference between the measurement value and the theoretical value in order to quickly control the growth speed of the monocrystal, thereby growing the monocrystal ingot.

The embodiment compares the predicted interface shape of the monocrystal ingot with the targeted interface shape of the monocrystal ingot, and after a step of changing the process conditions during the growth of the monocrystal ingot, repeats the step of determining whether the pulling speed is changed or not by deriving and comparing the measurement value and the theoretical value of the ingot for the unit time again. Therefore, the interface shape of the ingot may be predicted in real time, and accordingly, it is possible to control the targeted interface of the monocrystal ingot by changing the process conditions such as the pulling speed and the like in real time.

In order to obtain the targeted interface and a desired RRG value for the growth of the monocrystal ingot, the control values of the monocrystal growth are set based on the quality result of the ingot according to the result of the process which has been performed previously. As described above, the present invention may predict the interface shape of the ingot in real time about the growing ingot by the set control values.

Therefore, the process conditions are controlled so that the monocrystal ingot is grown in the targeted interface shape during the growing process of the monocrystal ingot, and the silicon ingot may be grown in the targeted interface shape. Therefore, the monocrystal growing method of the embodiment may improve the RRG or ORG quality of the grown ingot, and thus it is possible to provide a silicon wafer that meets the needs of customers.

Embodiments of the present invention are mostly described above. However, they are only examples and do not limit the present invention. A person skilled in the art may appreciate that several variations and applications not presented above may be made without departing from the essential characteristic of embodiments. For example, each component particularly represented in embodiments may be varied. In addition, it should be construed that differences related to such a variation and such an application are included in the scope of the present invention defined in the following claims.

The invention claimed is:

1. A monocrystal growing system as a system of controlling a growth interface shape by pulling up and growing a monocrystal ingot in a process chamber by a Czochralski method, the system comprising:
   an ingot weight measuring part for measuring a weight of a growing ingot;
   an ingot diameter measuring part for measuring a diameter of the growing ingot;
   an ingot height measuring part for measuring a height of the growing ingot;
   a comparing part configured to compare a measurement value obtained by measuring a weight increase amount of the ingot for unit time and a theoretical value of the ingot weight increase amount derived through a change in the diameter and the height of the ingot for the unit time; and
   a control part configured to predict a prediction result for a growth interface shape of the ingot to be grown according to a difference between the measurement value and the theoretical value derived from the comparing part and to change a process condition during monocrystal ingot growth according to the prediction result for the growth interface shape of the ingot.

2. The monocrystal growing system of claim 1, wherein the ingot weight measuring part measures the weight of the ingot at a specific time by a load cell connected to a wire provided on an upper portion of the process chamber and on which the monocrystal ingot is pulled.

3. The monocrystal growing system of claim 1, wherein the ingot diameter measuring part is provided on the upper portion of the process chamber and is measured by a camera illuminating a growth interface of the ingot.

4. The monocrystal growing system of claim 1, wherein the ingot height measuring part measures a length of an ingot body grown through a change in a height of a seed chuck supporting the ingot for the unit time.

5. The monocrystal growing system of claim 4, wherein the length of the ingot body is calculated by multiplying a current pulling speed of the ingot by the unit time.

6. The monocrystal growing system of claim 1, wherein the control part changes a pulling speed of the growing ingot according to the difference between the measurement value and the theoretical value transmitted from the comparing part.

7. The monocrystal growing system of claim 6, wherein when the measurement value is larger than the theoretical value, it is predicted that the interface shape of the monocrystal ingot protrudes convexly downward, and the control unit increases the pulling speed of the monocrystal ingot, thereby increasing a growth speed of the monocrystal ingot.

8. The monocrystal growing system of claim 6, wherein when the measurement value is smaller than the theoretical value, it is predicted that the interface shape of the monocrystal ingot is formed to be concave upward, and the control unit decreases the pulling speed of the monocrystal ingot, thereby reducing a growth speed of the monocrystal ingot.

9. A monocrystal growing method as a method for controlling a growth interface shape while growing a monocrystal ingot by a Czochralski method, the method comprising:
   a step of starting a growth of the monocrystal ingot after setting a control condition of a monocrystal growing process so that an interface of the ingot becomes a target shape;
   a step of deriving a measurement value by measuring a weight of the ingot grown for a predetermined time by means of a load cell disposed on an upper portion the monocrystal ingot;
   a step of deriving a theoretical value of the weight of the monocrystal ingot through a diameter of the monocrystal ingot measured by a diameter measuring camera disposed outside of a process chamber for a predetermined time and a height of the monocrystal ingot grown for the predetermined time;
   a step of deriving a difference between the measurement value and the theoretical value to predict a growth interface shape of the growing monocrystal ingot; and
   a step of comparing the predicted interface shape of the monocrystal ingot and the targeted interface shape of the monocrystal ingot and changing process conditions during growth of the monocrystal ingot.

10. The monocrystal growing method of claim 9, wherein the step of starting the growth of the monocrystal ingot after setting the control condition of the monocrystal growing process so that the interface of the ingot has the target shape sets the control condition of the monocrystal growing process based on the control condition of the monocrystal ingot growing process most recently performed and a quality of the monocrystal ingot grown accordingly.

11. The monocrystal growing method of claim 9, wherein the step of deriving the theoretical value of the monocrystal ingot weight through the diameter of the monocrystal ingot measured by the diameter measuring camera disposed outside of the process chamber for the predetermined time and the height of the monocrystal ingot grown for the predetermined time is derived by equation 1:

$$\Delta W = \pi (r/2)^2 \times (h2-h1) \times (K) \qquad \text{Equation 1.}$$

r: diameter of the ingot measured from the diameter measuring camera
h1–h2: height of the ingot changed for unit time
K: density of the ingot.

12. The monocrystal growing method of claim 9, wherein in the step of deriving the difference between the measurement value and the theoretical value and predicting the growth interface shape of the growing monocrystal ingot, in the case in which the measurement value is same as the theoretical value, it is predicted that the targeted interface shape of the ingot and the interface shape of the growing ingot are the same.

13. The monocrystal growing method of claim 12, wherein in the case in which the theoretical value is larger than the measurement value, it is predicted that the interface shape of the growing ingot is formed to be concave upward than the targeted interface shape of the ingot, and in the case in which the theoretical value is smaller than the measurement value, it is predicted that the interface shape of the growing ingot is formed to be convex downward than the targeted interface shape of the ingot.

14. The monocrystal growing method of claim 9, wherein in the step of comparing the predicted interface shape of the monocrystal ingot with the targeted interface shape of the monocrystal ingot and changing the process conditions during the growth of the monocrystal ingot, in the case in which the targeted interface shape of the monocrystal ingot and the predicted interface shape of the monocrystal ingot are the same, a pulling speed of the monocrystal ingot is kept the same as a current pulling speed.

15. The monocrystal growing method of claim 9, wherein in the step of comparing the predicted interface shape of the monocrystal ingot with the targeted interface shape of the monocrystal ingot and changing the process conditions during the growth of the monocrystal ingot, in the case in which the predicted interface shape of the monocrystal ingot is concavely recessed upward as compared with the targeted interface shape of the monocrystal ingot, a pulling speed of the monocrystal ingot is reduced so as to reduce a growth speed of the monocrystal ingot.

16. The monocrystal growing method of claim 9, wherein in the step of comparing the predicted interface shape of the monocrystal ingot with the targeted interface shape of the monocrystal ingot and changing the process conditions during the growth of the monocrystal ingot, in the case in which the predicted interface shape of the monocrystal ingot convexly protrudes downward as compared with the targeted interface shape of the monocrystal ingot, a growth speed of the monocrystal ingot is increased by increasing a pulling speed of the monocrystal ingot.

17. The monocrystal growing method of claim 9, wherein after the step of comparing the predicted interface shape of the monocrystal ingot with the targeted interface shape of the monocrystal ingot and changing the process conditions during the growth of the monocrystal ingot, further comprising deriving and comparing the measured value and theoretical value of the ingot for unit time again, and determining whether to change a pulling speed or not.

* * * * *